United States Patent [19]

McClure et al.

[11] Patent Number: 5,424,985
[45] Date of Patent: Jun. 13, 1995

[54] COMPENSATING DELAY ELEMENT FOR CLOCK GENERATION IN A MEMORY DEVICE

[75] Inventors: David C. McClure, Carrollton; William C. Slemmer, Dallas, both of Tex.

[73] Assignee: SGS-Thomson Microelectronics, Inc., Carrollton, Tex.

[21] Appl. No.: 170,612

[22] Filed: Dec. 20, 1993

Related U.S. Application Data

[63] Continuation-in-part of Ser. No. 85,751, Jun. 30, 1993.

[51] Int. Cl.$^6$ ............................................. G11C 13/00
[52] U.S. Cl. ...................................... 365/194; 365/233
[58] Field of Search ...................... 365/233, 194, 190

[56] References Cited

U.S. PATENT DOCUMENTS

| | | | |
|---|---|---|---|
| 4,710,902 | 12/1987 | Pelley, III et al. | 365/222 |
| 4,800,304 | 1/1989 | Takeuchi | 365/194 X |
| 4,841,488 | 6/1989 | Sanada | 365/194 X |
| 4,866,675 | 9/1989 | Kawashima | 365/193 X |

Primary Examiner—Do Hyun Yoo
Attorney, Agent, or Firm—Rodney M. Anderson; Lisa K. Jorgenson; Kenneth C. Hill

[57] ABSTRACT

Circuits and methods for generating a delay added to a clock signal which clocks an output of a first circuit into an input of a second circuit in a semiconductor device is disclosed. In a first embodiment, a delay circuit is provided for generating an output clock signal for controlling a circuit internal to an integrated circuit, such as a clocked sense amplifier in a memory device, relative to an earlier timing signal, such as a row select signal. The delay circuit is implemented by components having their design parameters, such as transistor dimensions and transistor orientation, corresponding to elements in an active portion of the circuit, such as memory cell transistors. Process variations that affect the electrical properties and the speed of the transistors in the active portion of the circuit will similarly affect the electrical properties and speed of transistors in the delay circuit, so the delay circuit can track and automatically compensate for process-induced speed variations, eliminating the need for large design time margins. Alternative embodiments are also disclosed which account for the threshold voltage drops across pass transistors in a memory array, and mimic the memory cell read current, when generating a sense amplifier clock signal.

20 Claims, 7 Drawing Sheets

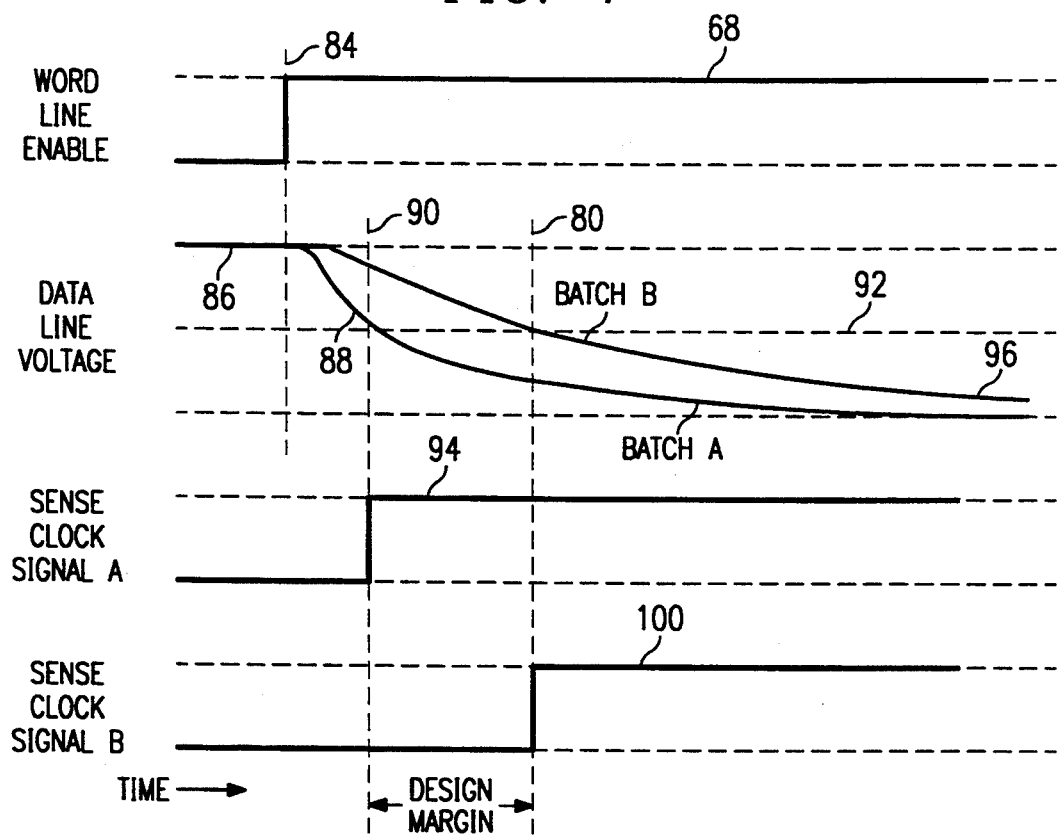
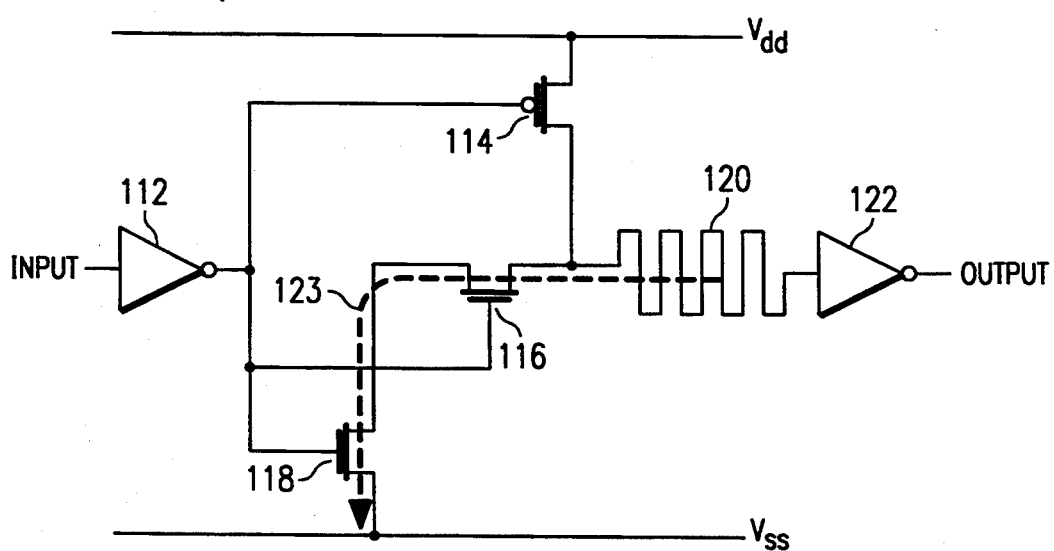

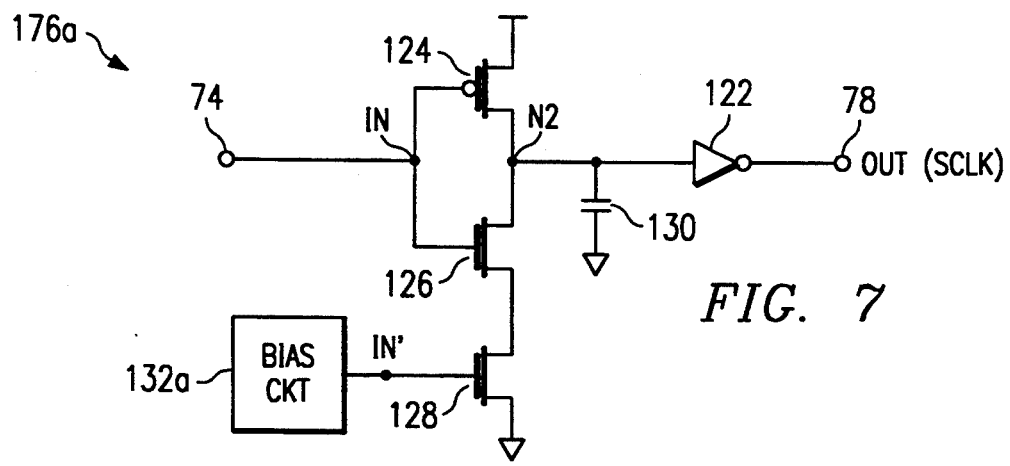
FIG. 7
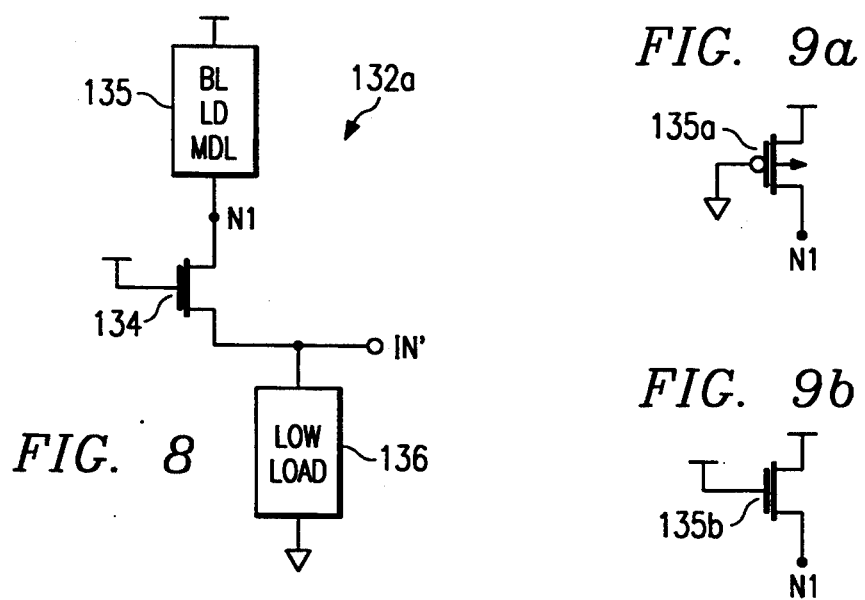
FIG. 8
FIG. 9a
FIG. 9b
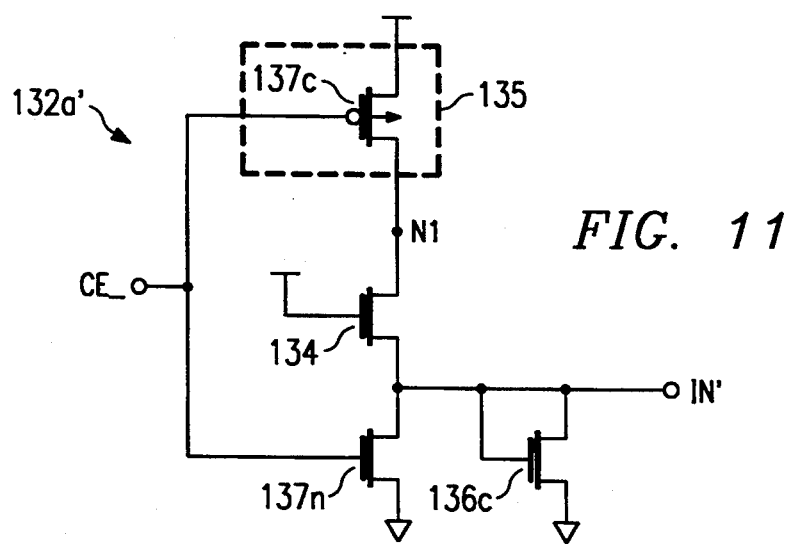
FIG. 11

COMPENSATING DELAY ELEMENT FOR CLOCK GENERATION IN A MEMORY DEVICE

This is a continuation-in-part of copending application Ser. No. 08/085,751, filed Jun. 30, 1993 (Attorney's Docket No. 93-C-26), assigned to SGS-Thomson Microelectronics, Inc. and incorporated herein by this reference.

This invention is in the field of semiconductor devices, and more is particularly directed to delay circuits used in the generation of clock signals for controlling a digital semiconductor device.

BACKGROUND OF THE INVENTION

Desirable design goals in electronic semiconductor manufacturing include a potential for significant cost reduction during the life of the design, high speed operation, low power consumption, and good reliability. In order to attain the goal of high speed operation, the many intermediate operations performed within the semiconductor device must be performed as quickly as possible, and with as little delay between operations as is practical to ensure reliable operation. Such intermediate operations may be synchronized by an internal clock signal. For example, if an output signal of a first intermediate operation is used as an input signal for a second intermediate operation, an internal clock signal may be utilized to synchronize the transfer of the output signal of the first intermediate operation to the input circuit of the second intermediate operation.

Unfortunately, increasing the speed of a semiconductor device is not as simple as increasing the speed of the internal clock which synchronizes the intermediate operations. One obstacle to increasing the speed of a semiconductor device is the amount of time required to transfer an output signal from a circuit performing a first intermediate operation to an input of a circuit performing a second intermediate operation.

One contributor to such a signal transfer delay is the operating speed of individual transistors within the semiconductor device. In many semiconductor devices, transistors are utilized in digital circuits in a manner that resembles an ordinary switch. However, such "transistor switches" do not "turn on" or "turn off" instantaneously; it takes a finite amount of time to move an electrical charge, which is sufficient to "turn on" or "turn off" the transistor, into or out of the semiconductor structure that forms the transistor. This time required to move a sufficient electrical charge to either "turn on" or "turn off" a transistor may be referred to as the transistor switching time and is typically in the range of a few nanoseconds.

In addition to high speed transistor operation, another semiconductor device design goal is to make the transistors within the device as small as practicable. A smaller transistor design allows designers to make devices having more transistors, and consequently, to make devices having greater functionality. There are problems, however, with fabricating devices with smaller transistors. For example, smaller transistors are more susceptible than larger transistors to manufacturing process variations, such as pattern alignment and chemical etching, during the many steps of semiconductor manufacturing. The reason for this increased susceptibility is that using a fabrication process step that produces transistor geometries accurate to within two units to fabricate a transistor that is, for example, one hundred units wide affects the electrical characteristics of that transistor proportionately less than using the same process step to fabricate a transistor that is ten units wide. Proportionately, the larger transistor's geometry is affected by two percent, while the smaller transistor's geometry is affected by twenty percent. Such process variations may cause the electrical properties of the transistors to vary, which may result in slower switching speeds.

Therefore, the overall speed of the device may be increased, but the uncertainty of transistor operating speed due to process variations may require designers to include an additional delay between intermediate operations to increase production yields. Production yield decreases as devices fail to function because of data errors, which may result from a signal transfer time increase in combination with a clock signal that prematurely clocks erroneous data into an input circuit. The timing involved in "clocking" signals between circuits is discussed in greater detail below.

In addition to the delay resulting from transistor switching time, semiconductor device speed may also be reduced by the electrical properties, such as capacitance and resistance, of interconnect lines within the semiconductor device. Interconnect lines may be conductors extending from a circuit in one part of the semiconductor device to a circuit in another part of the device, such as, for example, a "bit line" used to transfer data from a memory cell to a sense amplifier in a semiconductor memory device. A typical bit line extends from a memory cell, located in a memory array, across the memory array (which may be a substantial distance in terms of semiconductor geometries), to a sense amplifier, wherein such a transferred signal is prepared for transmission out of the semiconductor device. If an interconnect line has a relatively large intrinsic capacitance and resistance, it may take a considerable amount of time to transfer a signal via such an interconnect line. As the length of the interconnect line increases, the resistance and capacitance of the line may increase proportionately.

It is well known in the art of semiconductor design to utilize a clock signal to more precisely control the timing of intermediate operations, and the flow of input and output signals between circuits performing intermediate operations. Some clock signals within the semiconductor may be used to enable a circuit to "output" a signal, while other clock signals may be used to enable a circuit to receive or input a signal. Since it takes some time for a transistor to "turn on" an output signal after receiving an enabling output clock, and it takes some time for an output transistor to change the voltage of an interconnect line, an output signal from one circuit will not be immediately available as the input for a second circuit. Therefore, the clock signal utilized to enable the output a signal from a first circuit may not always be utilized as an input clock to enable the input of that same "output signal" into a second circuit. Stated differently, the clock signal for the input to the second circuit must occur sometime after the clock signal for the output of the first circuit so that the signal is allowed enough time to transfer between the two circuits.

To determine such a time difference between an output clock signal and an input clock signal, the designer must be able to calculate or predict transistor switching times, and the time necessary to "drive" or transfer the signal via the interconnecting line. Typically, once the designer has calculated the time required for a typical signal transfer, the designer includes an additional amount of time to compensate for variations in transistor switching times and "interconnect line drive times" which may occur due to variations in the numerous process steps required to make the semiconductor device.

In present semiconductor devices, the input clock signal may be delayed until such time as the output signal from the output circuit is likely to be present at the input circuit, considering worst-case process variations, which would cause a worst-case signal transfer time. Such worst-case process analysis includes the consideration of variations in process steps, such as chemical baths and mask alignment, which approach the extremes of process specifications, and the effect that such process variations may have on transistor switching times and the capacitance and resistance of interconnect lines.

As the semiconductor device is fabricated, it is subjected to a number of doping, layering, and patterning processes, each of which must meet stringent physical and cleanliness requirements. Such sophisticated processes will vary from one batch of semiconductor devices to another, resulting in speed variations from device to device. Even though the process is monitored and continually calibrated, some variation in the equipment and chemicals is inevitable. All of the tests and process specifications allow for some variation; that is, each semiconductor wafer experiences process variations, which may cause operational speed variations.

In the case of a semiconductor memory device, for example, process variations may affect the operational speed of the transistors comprising the individual memory cells. Additionally, process variations may affect the electrical characteristics, and hence the signal transfer time, of the bit line, which transfers the data signal from the memory cell to a clocked sense amplifier which determines what data was stored in the memory cell. This data signal transfer is controlled by a word line enable clock signal, which enables the output of the memory cell, and a sense clock signal, which enables the clocked sense amplifier to sense the data transferred via the bit lines.

In known memory devices, an additional amount of time is added to the calculated amount of delay between an active word line enable clock signal and an active sense clock signal that should permit normal, error-free operation. Such a calculated amount of delay corresponds to the amount of time required for the data signal to be transferred from the memory cell to the clocked sense amplifier, via the bit lines, in a device manufactured under the exact process conditions specified by the designer. The additional amount of time (i.e., time added as a design margin) is added to increase device yield by allowing for slower data signal transfers due to process variations, which may be well within specified tolerances. The drawback of increasing process yield by adding such a design margin time is that all devices are slower, even though some devices may operate internally at a higher speed.

Therefore, it is an object of the present invention to provide a method and circuit for automatically compensating a delay circuit, which is used to delay an input clock signal, in proportion to signal transfer speed variations due to process variations in the manufacture of semiconductor devices.

It is another object of the present invention to provide such a method and circuit for compensating a delay circuit used in generating a sense amplifier clock, relative to enabling of a word line, in random access memories such as static random access memories (SRAM) and dynamic random-access memories (DRAMs), and read-only memories (ROMs) of various types, including programmable ROMs such as EPROMs, EEPROMs, EAROMs, and the like.

It is another object of the present invention to provide such a method and circuit for compensating the sense amplifier clock delay circuit to account for the threshold drop across the access transistors in such an SRAM, such threshold drop slowing the bit line separation in a memory read operation.

Other objects and advantages of the present invention will be apparent to those of ordinary skill in the art having reference to the following specification together with the drawings.

SUMMARY OF THE INVENTION

A method and circuit are provided for significantly reducing a delay added to a clock signal which clocks an output of a first circuit into an input of a second circuit in a semiconductor device. An output of a first circuit is connected to a data line. The first circuit is designed with elements having a selected set of design parameters, such as transistor dimensions and transistor orientation. A second circuit is connected to the data line and also receives a clock signal generated by a signal delay circuit. The signal delay circuit receives an output enable signal, and after a delay period, produces the clock signal in response to the output enable signal. At least a portion of the signal delay circuit utilizes elements having the selected set of design parameters utilized in the first circuit. Thus, as process variations affect the electrical properties and the speed of the transistors in the first circuit, the same process variations will proportionately affect the electrical properties and speed of transistors in the delay circuit. This automatically compensates for process-induced speed variations and eliminates the need for a time margin when providing a clock signal for clocking an output of a first circuit into the input of a second circuit.

The delay circuit may also be incorporated in a memory device specifically to account for threshold voltage drops across the pass transistors in the memory array, which slow the establishing of a differential bit line voltage by the memory cell. For memories having substrate bias (by way of an external terminal or an on-chip charge pump), the threshold voltage of the pass transistors increases, according to the well-known body effect, increasing the voltage drop across the pass transistors and further slowing bit line separation. The delay circuit includes a bias circuit for biasing a transistor in such a way that switching of the delay circuit corresponds to the bit line separation of the memory cell, through modeling of the memory cell read current. The devices used to implement the bias circuit model or match those in the memory array, including the bit line load. This delay circuit compensates for the threshold voltage drop across the pass transistors, including body effect increases, allowing further accuracy in the generation of the sense amplifier clock signal.

BRIEF DESCRIPTION OF THE DRAWINGS

FIG. 4 illustrates a timing diagram for the circuit of FIG. 3.

FIG. 5 depicts a high level schematic diagram of a portion of a delay circuit in accordance with the present invention.

FIG. 7 is an electrical diagram, in schematic form, of a static delay circuit according to an alternative embodiment of the invention.

FIG. 8 is an electrical diagram, in block and schematic form, of a first embodiment of a static bias circuit useful in the delay circuit of FIG. 7.

FIGS. 9a and 9b are electrical diagrams, in schematic form, of alternative implementations of the model bit line load in the circuit of FIG. 8.

FIG. 11 is an electrical diagram, in schematic form, of a second embodiment of a static bias circuit in the delay circuit of FIG. 7.

DETAILED DESCRIPTION OF THE PREFERRED EMBODIMENTS

Figure 1:
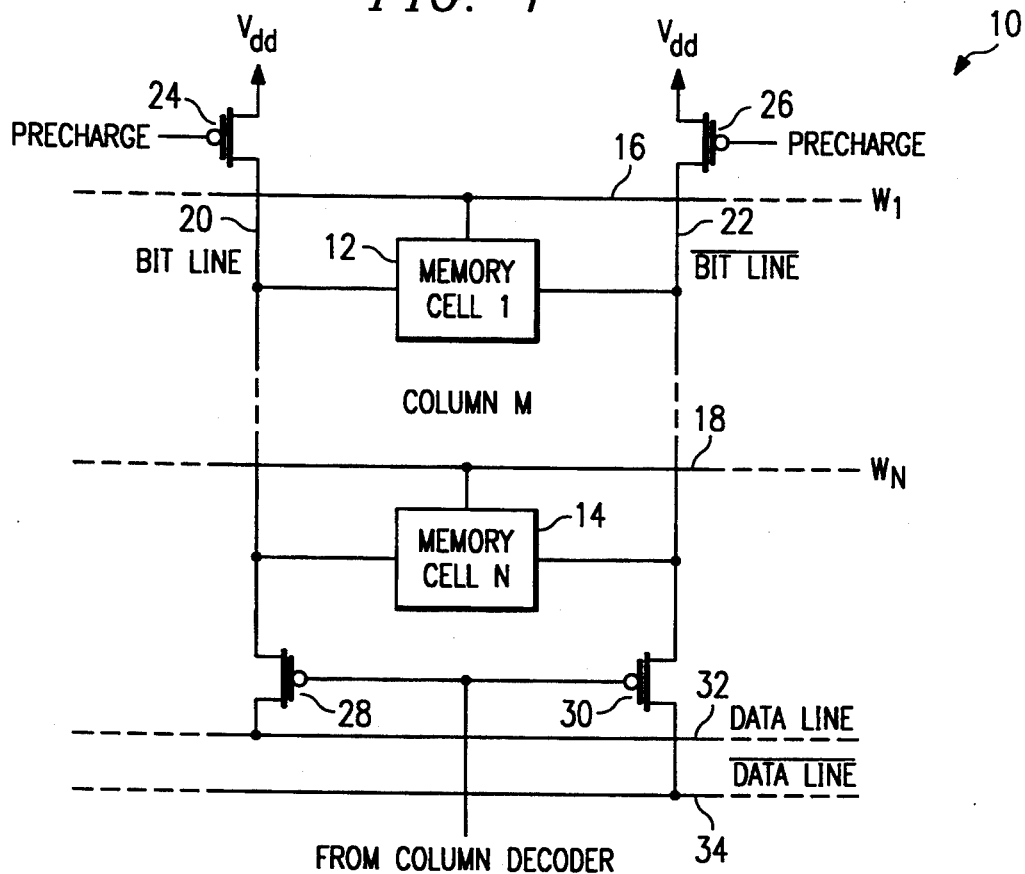
FIG. 1 depicts a high level block diagram of a portion of a memory cell array in a semiconductor memory device.

With reference now to the figures and in particular with reference to FIG. 1, there is depicted a high level block diagram of a portion of a memory cell array in a semiconductor memory device. Memory cells 12 and 14 are part of a memory array 10, which may include many columns and many rows of similar memory cells. For example, a single semiconductor memory device may contain $2^{20}$ memory cells (one megabit), and may be physically organized in any of a number of different layouts. Memory cells 12 and 14, and the remainder of the memory cells which comprise memory array 10 which are not shown, each store one data bit. To access a cell in memory array 10, a memory address is received into the memory device and decoded to determine a row and column address.

All cells in each row are connected to a "word line." In FIG. 1, word lines 16 and 18 are shown connected to cells 12 and 14 respectively. Word lines 16 and 18 are selected by "row decoder" circuitry (not shown). In a similar manner, all cells in each column are connected to a pair of "bit lines" 20 and 22, which are selected by "column decoder" circuitry (not shown). Bit lines 20 and 22 are connected to memory cells 12 and 14, and the other memory cells in the same column which are not illustrated. Transistors 24 and 26 serve as loads for the bit lines 20 and 22. When the column shown in FIG. 1 is not selected, transistors 24 and 26 precharge bit lines 20 and 22 to a DC voltage level close to the supply voltage. Transistors 28 and 30 are selected by the column decoder circuitry, and, when selected, connect bit lines 20 and 22 to data lines 32 and 34.

Figure 2A:
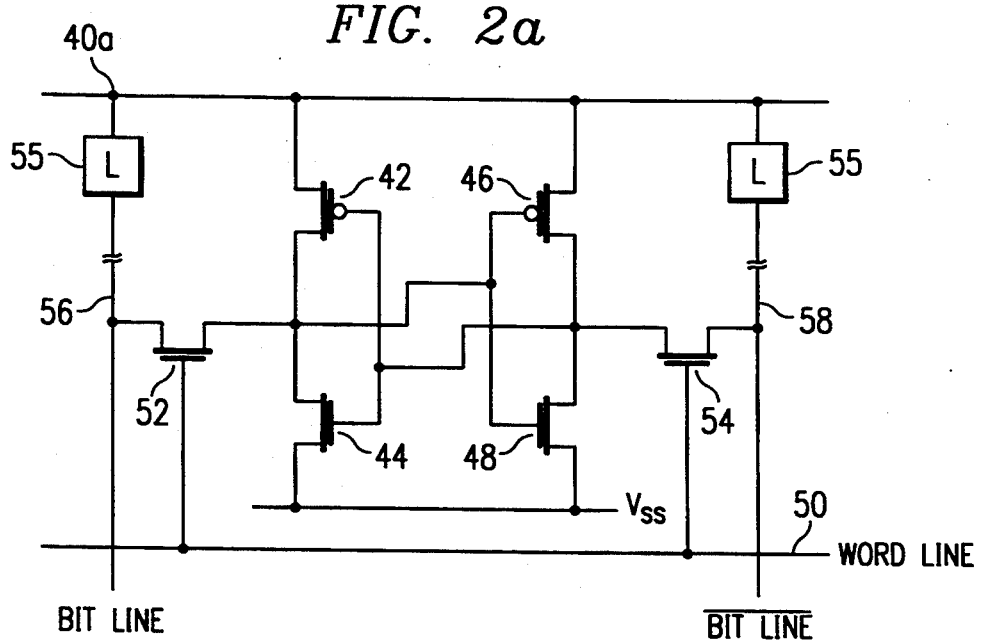
FIGS. 2a and 2b are electrical diagrams, in schematic form, of memory cells utilized in the memory array of FIG. 1.

FIG. 2a depicts a high level block diagram of a memory cell 40a, which may be utilized to implement memory cells 12 and 14 shown in FIG. 1. Memory cell 40a is an example of a static RAM cell. Memory cell 40a is largely comprised of a latch circuit formed by cross-coupling two inverters. Transistors 42 and 44 are part of a first inverter circuit, and transistors 46 and 48 are part of a second inverter circuit. As illustrated, the output of the first inverter circuit is used as the input of the second inverter circuit, and the output of the second inverter circuit is used as the input of the first inverter circuit. Word line 50 carries a signal that enables transistors 52 and 54, thereby permitting data to be transferred into or out of memory cell 40, via bit lines 56 and 58. Bit lines 56 and 58 are each pulled toward a power supply voltage, such as $V_{cc}$, by way of bit line loads 55, in the conventional manner. When data is transferred out of memory cell 40a, one of the cross-coupled inverters in memory cell 40a will discharge one of the associated bit lines, while the other cross-coupled inverter will not discharge the other bit line, depending upon what data was stored in memory cell 40a. Thus, the data signal on bit line 56 is the complement or opposite of the data signal on bit line 58.

Figure 2B:
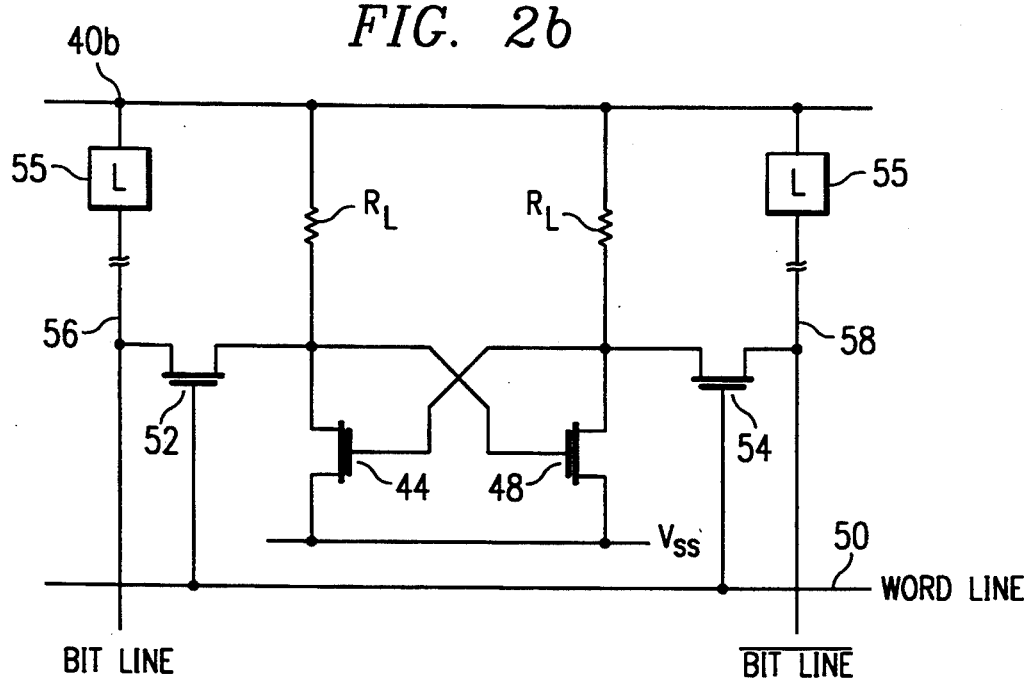

FIG. 2b illustrates a memory cell arrangement similar to that of FIG. 2a, but incorporating resistors $R_L$ as the load devices of the cross-coupled inverters rather than p-channel pull-up transistors 42, 44. Accordingly, memory cell 40b of FIG. 2b is constructed according to the four-transistor, two-resistor (4-T, 2-R) type, rather than the six-transistor (6-T) type of FIG. 2a. According to conventional manufacturing technology, resistors $R_L$ have extremely high resistance values, such as on the order of teraohms, so that the static power dissipation in the memory array is minimized.

Figure 3:
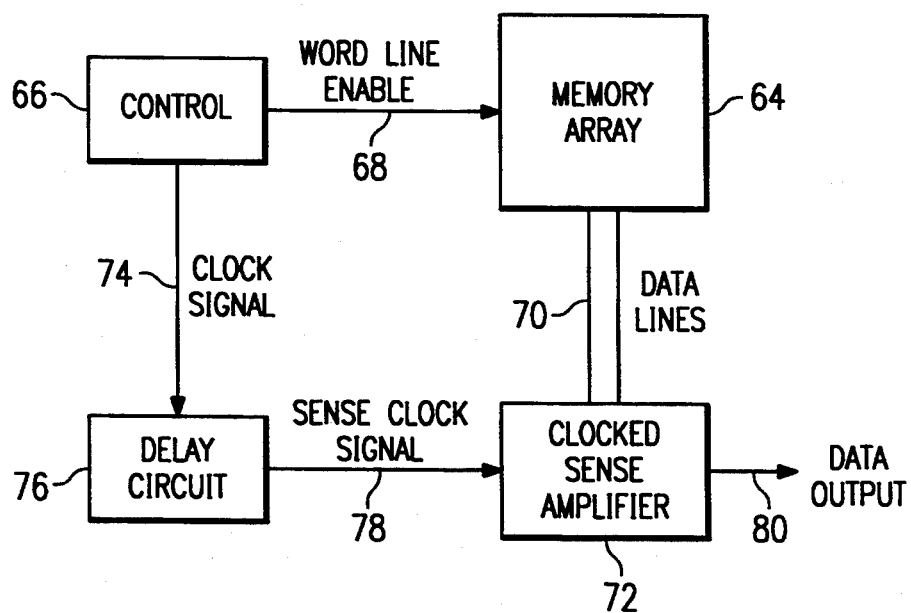
FIG. 3 depicts a high level block diagram of a portion of a semiconductor memory device.

Referring to FIG. 3, a high level block diagram of a portion of a semiconductor memory device is illustrated. In order to recall data from a memory array 64, a control circuit 66 produces a word line enable signal 68. Word line enable signal 68 causes a row of selected memory cells within memory array 64 to output data. One such cell utilizes a pair of data lines 70, which are connected to a clocked sense amplifier 72. Control circuit 66 also produces a clock signal 74 which is connected to a delay circuit 76. Delay circuit 76 produces a sense clock signal 78, which is connected to clocked sense amplifier 72, and causes clocked sense amplifier 72 to read a data signal on data lines 70. This data read by clocked sense amplifier 72 is determined by which one of two data lines 70 has been discharged by a cross-coupled inverter in memory cell 40. After clocked sense amplifier 72 determines what data is represented by the signals on data lines 70, clocked sense amplifier 72 may latch, and thereafter output such sensed data via data output line 80.

Referring now to FIG. 4, a timing diagram for the circuit of FIG. 3 is illustrated. During the process of recalling data from memory array 64, the word line enable signal 68 enables a selected memory cell 40 to output data via data lines 70, at a time indicated by numeral 84 (time 84). Shortly after word line enable 68 is activated at time 84, data line voltage 86 begins to fall on one of the data lines 70, while the other data line remains high or charged. Batch A 88 illustrates how the voltage should drop on a data line 70 in a semiconductor memory device which has been processed under an ideal set of process steps having no process variation. At time 90, the data line voltage 86 of a data line 70 has dropped to a voltage level 92 such that the clocked sense amplifier 72 may correctly and reliably determine what data has been transferred via data lines 70 by measuring the differential voltage between data lines 70. Voltage level 92 may be considered a "threshold" voltage of the clocked sense amplifier 72. That is, if the clocked sense amplifier receives a sense clock signal prematurely, and a data line signal having a voltage higher than "threshold" voltage level 92 is sensed, a data error may occur.

To illustrate the effect process variations may have upon signal transfer speed and sense clock signal timing, two data line voltage curves 86 are illustrated: a batch A 88 voltage curve depicting a rate of voltage change on a data line in a device fabricated under batch A process conditions, and a batch B 96 voltage curve depicting a rate of voltage change on a data line in a device fabricated under batch B process conditions. Therefore, in light of the rate at which data line voltage 86 falls to voltage level 92 in a device produced in batch A 88, clocked sense amplifier 72 may be clocked and caused to sense the voltage on data lines 70 at time 90, as indicated by sense clock signal A 94.

The voltage curve associated with batch B 96 indicates the rate at which voltage may drop on data lines 70 in a semiconductor fabricated in a batch of semiconductor devices under the same general process steps as batch A, but with different specific parameters, which fall within specified tolerance limits, from the specific parameters of batch A 88. As illustrated, the data line voltage 70 of batch B 96 discharges more slowly than the data line 70 of a part produced in batch A 88. Due to such process variations during the fabrication of batch B 96, the clocked sense amplifier 72 in batch B 96 parts must be sensed at time 80, so that data line voltage 86 has dropped to voltage level 92, as illustrated by sense clock signal B 100. In the prior art, a designer must add an additional delay time to the sense clock signal to ensure the devices of batch B 96 would operate properly. Such additional delay time is the amount of time between time 90 and time 80, labeled "Design Margin."

Referring now to FIG. 5, a delay circuit 110 for generating a clock signal in accordance with the present invention is illustrated. A signal to be delayed enters delay circuit 110 at the input of inverter 112. The output of inverter 112 is connected to the gates of transistors 114, 116, and 118, which are connected and arranged to form an inverter circuit. When a "high" (a voltage close to $V_{cc}$) is applied to the input of this three-transistor inverter circuit, transistor 114 will turn off and transistors 116 and 118 will turn on, which will attempt to drive the three-transistor inverter output "low" (a voltage close to ground). Conversely, when a low is applied to the input, transistor 114 will turn on and transistors 116 and 118 will turn off, which will attempt to drive the three-transistor inverter output high.

In accordance with the present invention, the size, orientation, and other design parameters of transistors 116 and 118 are selected to emulate the performance of transistors 54 and 48, or of transistors 52 and 44, of memory cell 40a, 40b illustrated in FIGS. 2a and 2b (collectively referred to herein as memory cell 40). Transistors 116 and 118 may have the exact same layout as transistors 54 and 48, and transistors 52 and 44. Therefore, as transistors 54 and 48, or transistors 52 and 44, of memory cell 40 are affected by process variations, transistors 116 and 118 will be similarly affected. If, due to process variations, transistors 54 and 48, or transistors 52 and 44, of memory cell 40 operate slower, which causes the signal developed by memory cell 40 to appear at the input of clocked sense amplifier 72 at a later time, then transistors 116 and 118, which are similarly affected by process variations, will delay sense clock signal 78 by a proportional amount of time, so that clocked sense amplifier 72 is clocked by sense clock signal 78 when the signal developed by memory cell 40 arrives at the input of clocked sense amplifier 72.

Because the electrical characteristics of bit lines 56 and 58 have an effect on the timing of the data transfer from memory cell 40 to clocked sense amplifier 72, a bit line emulation structure 120 is connected between the output of the three-transistor inverter and inverter 122, so that the amount of delay produced by delay circuit 76 more closely tracks the delay of memory cell 40, which drives bit line 56 or 58. The discharge path 123 through bit line emulation structure 120 and transistors 116 and 118 emulates the discharge path of memory cell 40, which passes through bit line 56 or 58 and transistors 54 and 48, or 52 and 44 of FIGS. 2a and 2b.

Those persons skilled in the art of semiconductor design will appreciate that the resistance and capacitance of bit line emulation structure 120 need not be the same as either bit line 56 or 58, because bit line emulation structure 120 must be discharged to a voltage which can be sensed by inverter 122. Therefore, bit line emulation structure 120 may be only 20% as long as bit line 56 or 58, which would allow bit line emulation structure 120 to discharge to below two volts (which may be the threshold voltage of the input to inverter 122) in an amount of time proportionate to the time required to discharge bit line 56 or 58 by 100 millivolts (which may be the threshold voltage of the input to clocked sense amplifier 72). The design of bit line emulation structure 120 should be coordinated with the selection of an input threshold for inverter 122.

Therefore, to produce a higher device yield and to produce a faster device, at least a portion of the circuit of the memory cell is duplicated as part of the delay circuit, in an effort to duplicate the signal path from the memory cell to the clocked sense amplifier. By including a circuit similar to the memory cell circuit in the delay circuit, the delay circuit will automatically increase the delay time to compensate for increased signal transfer time due to the effects of process variation on memory cell circuitry. The automatic increase in delay time means that a device may be designed for a typical sense clock signal delay, and not a worse-case delay. By replicating at least a part of the memory cell circuit in the delay circuit, devices may be designed without the previously required additional delay time included as a design margin to increase device yield, and which makes every device operate slower. After incorporating the present invention, every device may operate at its highest potential speed, rather than all devices operating at a slower speed by an amount of time equal to the design margin (the difference between time 80 and time 90). This additional amount of time, although measured in nanoseconds, can determine whether or not a device will perform a function in a data processing system designed for operation at a particular speed.

Those persons skilled in the art of semiconductor design will recognize that in order to duplicate the effect of process variations on signal transfer, the "output load" of a particular circuit may also be replicated in the delay circuit. For example, the load connected to the output of memory cell 40 is largely bit line 56 or 58, which has an inherent resistance and capacitance. At least a portion of a line representing the bit line may be included in the delay circuit connected to the output of the circuit replicating the memory cell.

An example of such a line is bit line emulation structure 120. Bit line emulation structure 120 may be fabricated from the same material, with the same width dimensions, and placed over the same underlying material and geometries, as bit lines 56 and 58. Such underlying material may simulate word lines, or other structures affecting the electrical properties of the bit line, over which the bit line lies. Similarly, overlying material may also be considered in bit line emulation structure 120 design. To more efficiently utilize space, bit line emulation structure 120 may be laid out in a serpentine pattern. By including bit line emulation structure 120 in delay circuit 76, process variations which affect the electrical characteristics of the memory cell load will proportionately affect the replica load, such as bit line emulation structure 120, in the same manner, thereby compensating the delay of sense clock signal 78 for process variations during fabrication.

Those persons skilled in the art will also recognize that other circuits may be included in the delay circuit, so long as such circuits are affected by process variations in proportion to the effect process variations have on a circuit supplying a clocked output signal to another circuit having a clocked input signal. That is, the delay circuit need not physically replicate the output circuit and load of a first circuit; the delay circuit need only include a circuit having a signal transfer time affected by process variations in proportion to the effects those same process variations would have on the output circuit and load of the first circuit. Therefore, a set of transistors duplicating transistors 116 and 118 may be added in parallel with transistors 116 and 118 (thereby creating a parallel current path), and the overall delay produced by delay circuit 110 will continue to be proportional to the delay of the signal developed by memory cell 40.

Moreover, additional circuits may be added to the delay circuit to more thoroughly duplicate the circuit supplying the clocked output signal. For example, transistors 28 or 30, which are each in a signal path from memory cell 40 to clocked sense amplifier 72, may be duplicated in delay circuit 76.

For purposes of fully understanding the benefits of the above embodiment of the invention as well as an alternative embodiment of the invention to be described hereinabove, attention is directed to FIG. 6, which illustrates a conventional example of clocked sense amplifier 72. Of course, other conventional sense amplifier and write driver designs may be used in place of that shown in FIG. 6 and that may benefit from the present invention, it being understood that this example is provided herein by way of example only.

Figure 6:
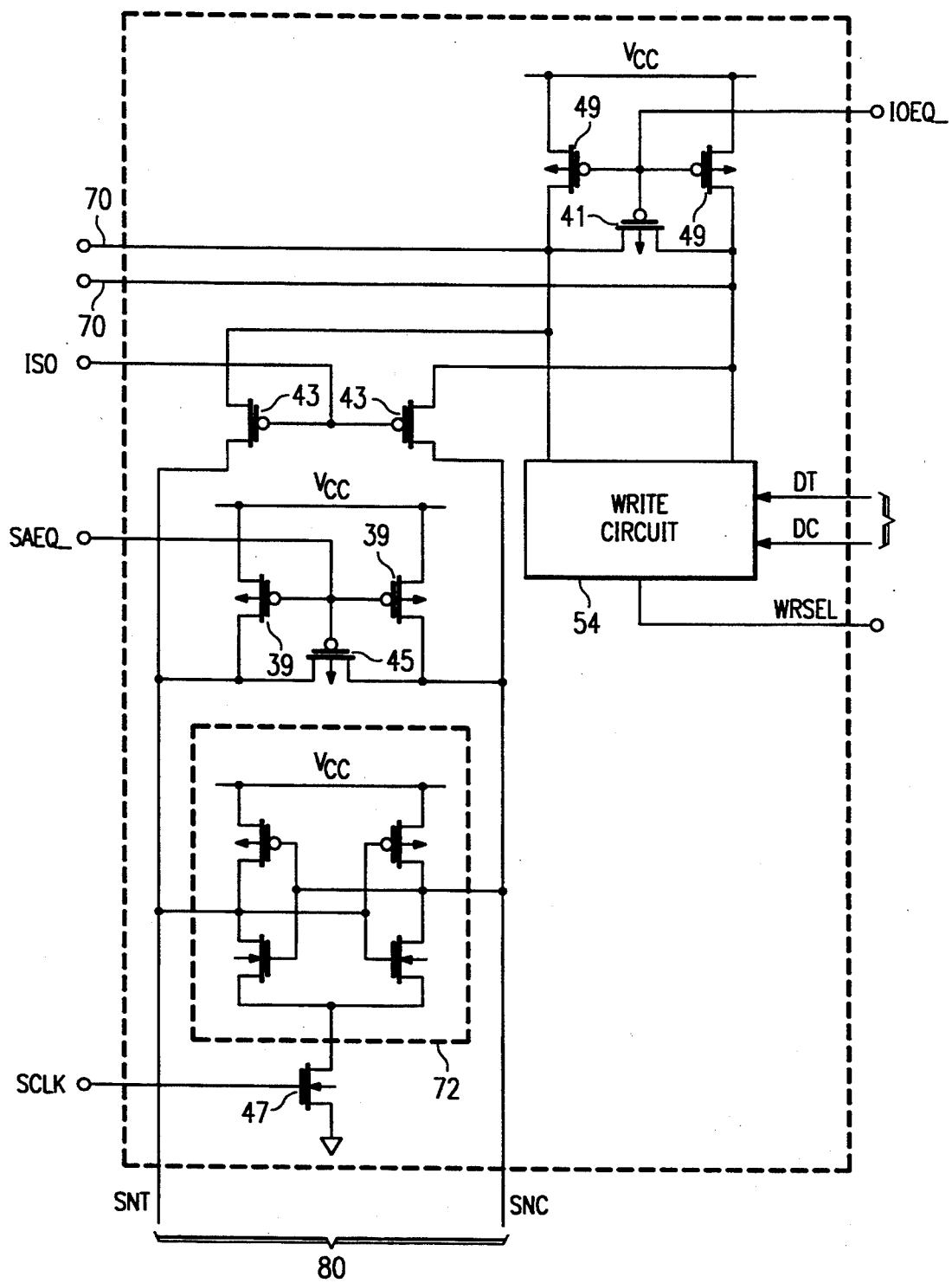
FIG. 6 is an electrical diagram, in schematic form, of an example of a typical clocked sense amplifier arrangement used in the memory of FIG. 3.

Input/output lines 70, $70_{13}$ in FIG. 6 receives the state produced by memory cell 40 on the differential bit lines 58, 56, respectively, via pass gates or other select circuitry used to select a column in memory array 64 according to the column address value, as is well known in the art. Input/output lines 70, $70_{13}$ are each connected (via a pass gate or other select circuitry as necessary) to the drain of a p-channel precharge transistor 49, the sources of which are both connected to a precharge voltage which, in this case, is $V_{cc}$. Input/output lines 70, $70_{13}$ are also connected to one another by p-channel equilibration transistor 41. The gates of transistors 41 and 42 are connected to line $IOEQ_{13}$, which is generated by timing and control circuitry in memory 1 responsive to the initiation of a memory cycle, such as an address transition.

For purposes of sensing, the differential voltage generated by memory cell 40 on the bit lines of the selected column is communicated by I/O lines 70, $70_{13}$ to clocked sense amplifier 72 via p-channel pass transistors 43, which have their gate controlled by an isolate signal on line ISO. Sense amplifier 72 is a conventional CMOS latch consisting of cross-coupled inverters therewithin; the inputs and outputs of the cross-coupled latches are connected to sense nodes SNT and SNC in the conventional manner, to which I/O lines 70, $70_{13}$ are coupled by isolation transistors 43 during sensing.

Sense nodes SNT and SNC are also preferably precharged and equilibrated during the appropriate portion of the cycle, by way of p-channel precharge transistors 39 connected between $V_{cc}$ and sense nodes SNT and SNC, respectively, and by way of p-channel equilibration transistor 45 connected between sense nodes SNT and SNC. The gates of transistors 45 and 46 are controlled by line $SAEQ_{13}$ which, when at a low level, precharges and equilibrates sense nodes SNT and SNC in the conventional manner. Write circuitry 54 receives input data on lines DT, DC and a write control signal WRSEL, and includes conventional write drivers for driving I/O lines 70, $70_{13}$ with input data during a write cycle.

During read operations, sense amplifier 72 is clocked by n-channel pull-down transistor 47, which has its source-to-drain path connected between the sources of the n-channel transistors in sense amplifier 72 and ground. The gate of transistor 47 is controlled by clock signal SCLK produced by the delay circuits according to the present invention and described herein. Pull-down transistor 47 provides dynamic control of sense amplifier 72, so that the amplification of sense nodes SNT and SNC is performed in dynamic fashion. As is well known in dynamic RAMs, the dynamic sensing in this arrangement is controlled with transistor 47 initially off at the time that pass transistors 43 connect input/output lines 70, $70_{13}$ to sense nodes SNT and SNC, respectively; during this portion of the cycle, sense amplifier 72 is presented with a small differential voltage between sense nodes SNT and SNC. After development of this small differential voltage, line SCLK is driven high, so that the sources of the pull-down transistors in sense amplifier 72 are pulled to ground. This causes sense amplifier 72 to amplify and latch the differential signal on sense nodes SNT and SNC; sense nodes SNT and SNC are communicated to input/output circuitry in the conventional manner, for presentation to external terminals of the memory.

Premature clocking of sense amplifier 72, prior to full bit line separation, could result in the amplification of a differential voltage of the incorrect polarity, as it is known that the relative polarity of differential bit lines vary over time prior to full bit line separation. As noted above, delay circuit 76 according to the present invention, and also the delay circuit to be described hereinbelow relative to another embodiment of the present invention, may be used to advantage in generating the clock signal on line SCLK to clocked sense amplifier 72.

It has been observed that, in some implementations of memories, such as SRAMs utilizing memory cell 40b with resistive loads as described hereinabove relative to FIG. 2b, the generation of an adequate differential voltage on the bit lines is slowed by pass transistors 52, 54. This is due to the voltage drop across transistors 52, 54 when turned on by the word line; this voltage drop is on the order of the threshold voltage of the transistor, as may be affected by the transistor body effect. As is well known in the art, the small dimensions of memory cell transistors, especially considering the effects of field implant encroachment, cause the threshold voltage of memory cell pass transistors 52, 54 to be relatively high. Particularly for memory cell 40b incorporating extremely high load resistors $R_L$, such as on the order of teraohms, the voltage drop across the pass transistor 52, 54 will slow the generation of the differential bit line voltage by selected memory cell 40, requiring later clocking of clocked sense amplifier 72. In addition, considering that pass transistors 52, 54 operate as source followers, a non-zero voltage differential is present between the source of each of pass transistors 52, 54 and its corresponding body node, which is at ground or at a negative bias voltage. Due to the transistor body effect, this voltage differential increases the threshold voltage of each of pass transistors 52, 54, increases the threshold voltage drop thereacross, and as a result slows the bit line separation in a read cycle. For those memories in which the substrate or well is biased to a negative voltage, the threshold voltage of pass transistors 52, 54 will be increased even further, resulting in additional slowing of the bit line separation.

Referring now to FIG. 7, static delay circuit 176a according to an alternative preferred embodiment of the invention will now be described in detail. Static delay circuit 176a is specifically designed for the generation of the clock signal SCLK to clocked sense amplifier 72 in such a manner as to account for the voltage drop across pass transistors 52, 54, including the body effect increase in the threshold voltage thereof, and thus for the additional delays in the separation of bit lines caused by such a voltage drop and variations therein. Use of static delay circuit 176a according to this embodiment of the invention is therefore especially advantageous in those SRAMs utilizing high resistance loads in the memory cells, especially in those which utilize substrate bias techniques.

According to this embodiment of the invention, static delay circuit 176a includes an inverter formed by p-channel transistor 124 and n-channel transistor 126. The gates of transistors 124, 126 are connected together at node IN to receive the input clock signal from line 74. The drains of transistors 124, 126 are also connected together at node N2 to drive the input of inverter 122 and, in turn, the output clock signal on line OUT; according to this embodiment of the invention, the output of delay circuit 176a drives the sense amplifier clock signal on line SCLK of FIG. 6. Capacitor 130 is also coupled to the drains of transistors 124, 126, to emulate the response of bit line in similar manner as bit line emulation structure 120 in delay circuit 76, as described above. The source of transistor 124 is biased to $V_{cc}$, and the source of transistor 126 is connected to the drain of n-channel transistor 128; the source of transistor 128 is biased to ground. Delay circuit 176a according to this embodiment of the invention also includes bias circuit 132a for controlling the voltage at the gate of transistor 128.

To provide compensation for process-induced speed variations, as described hereinabove, the characteristics of certain transistors in delay circuit 176a are preferably selected to match those of transistors in memory cell 40. The transistor characteristics of interest according to this embodiment of the invention correspond to those characteristics that may vary in processing or operation of the memory. Examples of these characteristics include the physical dimensions of the transistors, such as channel length and channel length and, if applicable, orientation of the physical transistor elements. In addition, other characteristics such as those that define threshold voltage and other similar parameters of the transistors in memory cell 40 are also preferably matched by the elements of delay circuit 176a; however, these parameters are often the same for transistors on the same integrated circuit regardless of size, and as such are already matched merely by residing on the same integrated circuit. In this embodiment of the invention, the width/length ratio (W/L) of transistor 126 matches that of pass transistors 52, 54 in memory cell 40, and the W/L of transistor 128 preferably matches that of transistors 44, 48 in memory cell 40. For example, the size of each of transistors 52, 54, and 126 may be on the order of 0.9 microns/0.8 microns (width/length), and the size of each of transistors 44, 48, 128 may be on the order of 2.1 microns/0.7 microns.

According to this embodiment of the invention, bias circuit 132a biases the gate of transistor 128 to a voltage corresponding to that seen at the high cross-coupled node in memory cell 40, including the threshold drop presented by the pass transistor 52, 54. Referring now to FIG. 8, the construction and operation of bias circuit 132a according to this embodiment of the invention will now be described.

Bias circuit 132a according to this embodiment of the invention includes model bit line load 135 connected between $V_{cc}$ and node IN'. Model bit line load 135 is implemented according to the type of bit line pull-up scheme utilized in memory array 64, and as such will generally be implemented as a scaled model (including 1:1 scale) of bit line load 55, preferably including consideration of characteristics such as size, orientation, threshold voltage, and the like. If bit line load 55 is decoded or otherwise switched out for unselected columns, model bit line load 135 is constructed to match the bit line load 55 as it appears to the bit lines for a selected column.

Referring now to FIGS. 9a and 9b, alternative embodiments of model bit line load 135 are illustrated. Model bit line load 135 of FIG. 9a is implemented as p-channel transistor 135a with its source biased to $V_{cc}$ and its gate biased to ground; the drain of transistor 135a is connected to node N1. FIG. 9b illustrates the implementation of model bit line load 135 as n-channel transistor 135b with its drain and gate connected to $V_{cc}$, and its source connected to node N1. The conductivity type and transistor size of model bit line load 135 preferably corresponds exactly to that used as bit line load 55 in the memory, for optimum matching and process variation compensation.

Referring back to FIG. 8, bias circuit 176a also includes n-channel transistor 134, which has its drain connected to node N1 and its gate biased to $V_{cc}$. Transistor 134 is intended to correspond to pass transistors 52, 54, and as such the size (i.e., channel length and channel width) and other characteristics of transistor 134 should match those of transistors 52, 54 in memory cell 40. The source of transistor 134 is connected to node IN', and thus to the gate of transistor 128 (FIG. 7). Transistor 134 is thus implemented as a source follower, and as such its threshold voltage will be increased by the body effect resulting from the differential voltage between its source at node IN' and its body node, which is at ground or negative substrate bias. The threshold voltage of transistor 134 will thus track the threshold voltage of pass transistors 52, 54.

According to this construction of bias circuit 176a, the voltage at node IN' is maintained at the value $(V_{cc} - V_{tn})$, where $V_{tn}$ is the threshold voltage of n-channel transistor 135 (and thus n-channel transistors 52, 54, 126), including any body effect increase. By maintaining node IN' at this voltage, the behavior of response of node N2 (FIG. 7) to receipt of a high logic level at node IN (line 74) will substantially match that at the lower voltage cross-coupled node of selected memory cell 40, as the current through transistor 128 is mimicking the read current of memory cell 40.

This correspondence may be made apparent by correlating the transistors in delay circuit 176a (including bias circuit 132a) to the transistors in memory cell 40b of FIG. 2b. For example, consider that memory cell 40b of FIG. 2b is storing a "zero" state, such that the drain of transistor 48 and the gate of transistor 44 is at the memory cell high level, and the drain of transistor 44 and the gate of transistor 48 are at the memory cell low level. Transistor 128 will thus correspond to transistor 44, which has its gate biased with the memory cell high level. Transistor 126 of delay circuit 176a thus corresponds to pass transistor 52, through which transistor 44 will be discharging bit line 56 in establishing a low logic level thereat during a read cycle. One may then consider model bit line load 135 of bias circuit 132a as corresponding to bit line load 55, and transistor 134 of bias circuit 132a as corresponding to pass transistor 54. As such, the gate of transistor 128 at node IN' is biased by bias circuit 132a to a voltage modeling the gate voltage of transistor 44, which is the minimum memory cell high level voltage. Transistor 128 will thus conduct a current equivalent to the memory cell read current of memory cell 40.

As a result of this correspondence, the response at node N2 of delay circuit 176a to a low-to-high transition at node IN (clock signal 74) corresponds to the response of bit line 56 in memory cell 40b of FIG. 2b to energizing the word line to a high level. Since each of the components in delay circuit 176a (and bias circuit 132a) physically or effective matches its corresponding component in the selected memory cell, variations in processing parameters will affect delay circuit 176a in a similar manner as such variations affect the memory cell. In addition, according to this preferred embodiment of the invention, the threshold voltage drop (including body effect increase due to substrate or well bias) of pass transistors 52, 54 also appears via transistors 126, 134, and the delay through delay circuit 176a is adjusted accordingly. Threshold voltage variations in transistors 52, 54 of memory cell 40 will thus be reflected in the threshold voltage of transistors 126, 134, and thus reflected in the response of delay circuit 176a. The sense amplifier clock signal on line SCLK, generated by delay circuit 176a at its node OUT, is thus able to compensate for the threshold voltage drop across the pass transistors in memory cell, including the body effect increase thereof and the resultant decrease in memory cell read current.

According to this embodiment of the invention, bias circuit 176a also includes low load 136, connected between node IN' and ground. The function of low load 136 is to eliminate the vulnerability of the voltage at node IN' from voltage bump situations (i.e., variations, or slew, in the voltage $V_{cc}$). As such, low load 136 preferably leaks just enough current to maintain the voltage at node IN' at the desired $V_{cc} - V_{tn}$ (body effect) level, despite variations in $V_{cc}$.

Figure 10A:
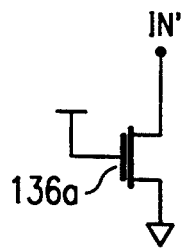
FIGS. 10a through 10f are electrical diagrams, in schematic form, of alternative implementations for the low level load in the circuit of FIG. 8.
Figure 10B:
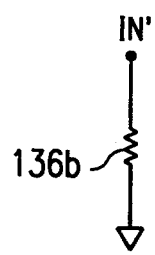
Figure 10C:
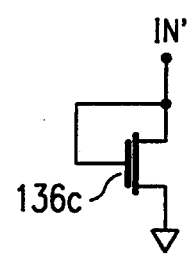
Figure 10D:
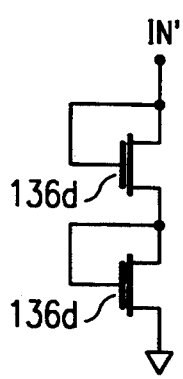
Figure 10E:
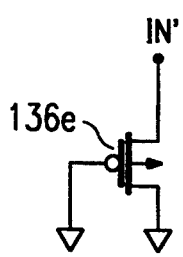
Figure 10F:
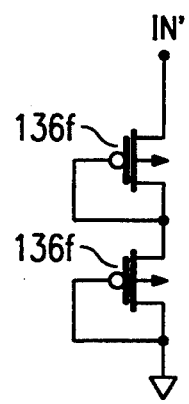

FIGS. 10a through 10f illustrate various implementations of low load 136. FIG. 10a shows the implementation of low load 136 as a weak n-channel transistor 136a having its drain connected to node IN' its source at ground, and its gate tied to $V_{cc}$. In FIG. 10b, low load 136 is implemented as high resistance resistor 136b. FIG. 10c illustrates the implementation of low load 136 as weak n-channel transistor 136c, having its drain and gate biased to node IN' and its source at ground. FIG. 10d illustrates low load 136 implemented as a series chain of weak n-channel transistors 136d connected between node IN' and ground, each with their gates tied to their drains. Conversely, low load 136 may be implemented as weak p-channel transistor 136e having its source at node IN' and its gate and drain at ground, as shown in FIG. 10e. Similarly as in FIG. 10d, low load 136 may also be implemented as a series chain of weak p-channel transistors 136f connected between node IN' and ground, each with their gates tied to their drains, as shown in FIG. 10f. Of course, other implementations of low load 136 will be apparent to those of ordinary skill in the art having reference to this specification.

Referring now to FIG. 11, bias circuit 132a' according to an alternative implementation will now be described in detail. Bias circuit 132a described above relative to FIG. 7 includes a DC path between $V_{cc}$ and ground, through the action of model bit line load 135, transistor 134, and low load 136. While the impedance of low load 136 may be increased to be quite high, current will continue to be drawn through this circuit, which is undesirable in low power applications. Bias circuit 132a' includes the ability to be disabled by a control signal such as a chip enable signal, such that no DC power is dissipated thereby when in standby mode.

In bias circuit 132a', model bit line load 135 is implemented as p-channel transistor 137p, having its source biased to $V_{cc}$, its drain at node N1, and its gate controlled by chip enable signal $CE_{13}$ (indicating standby mode when high, and enable mode when low). N-channel transistor 134 has its drain at node N1, its source at node IN', and its gate at $V_{cc}$, as before. Bias circuit 132a' also includes n-channel transistor 137n having its drain connected to node IN', its source at ground, and its gate also controlled by chip enable signal $CE_{13}$. Low load 136 is implemented by n-channel transistor 136c with its drain and gate at node IN' and its source at ground, as described earlier relative to FIG. 10c.

In operation, when the memory is enabled by chip enable line $CE_{13}$ being low, transistor 137p is turned on and transistor 137n is turned off. Bias circuit 132a' thus operates in the same manner as bias circuit 132a described hereinabove. Upon chip enable line $CE_{13}$ going high to effect standby mode, transistor 137p is turned off, disconnecting node N1 from $V_{cc}$ and thus interrupting the DC path between $V_{cc}$ and ground through transistors 137p, 134, 136c. In addition, transistor 137n is turned on, discharging node IN' to ground so that transistor 128 in delay circuit 176a (FIG. 7) is turned off, interrupting the DC path between $V_{cc}$ and ground therein. Accordingly, the use of bias circuit 132a' disables delay circuit 176a in standby mode, eliminating static power dissipation therethrough.

Figure 12:
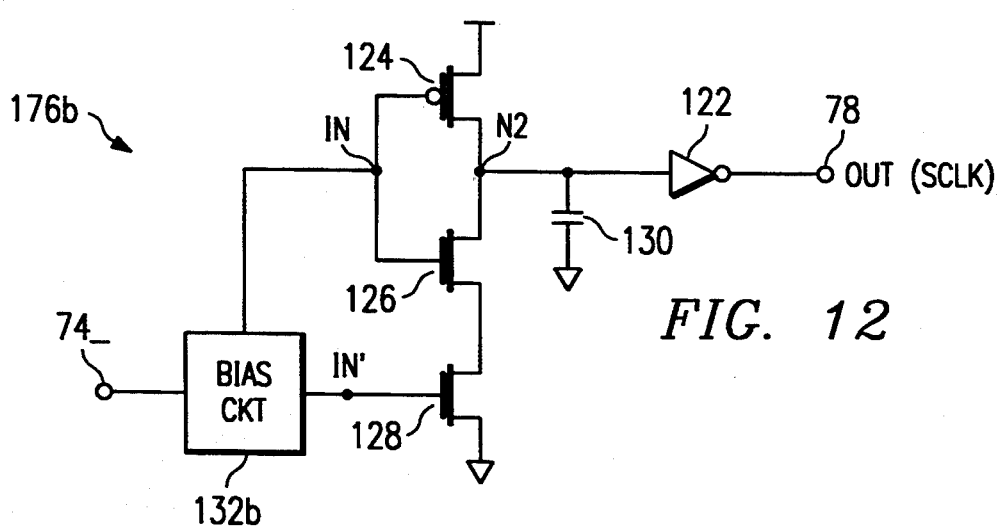
FIG. 12 is an electrical diagram, in schematic form, of a dynamic delay circuit according to an alternative embodiment of the invention.

Referring now to FIG. 12, the construction and operation of dynamic delay circuit 176b will now be described in detail, with similar elements in FIG. 12 as those described above relative to FIG. 7 will be referred to by the same reference numerals. Dynamic delay circuit 176b provides the further advantages that no low load is required in order to eliminate voltage bump vulnerability. In addition, no chip deselect signal is necessary to eliminate static current paths in standby mode. In addition, the source follower action of the pass transistor 52, 54 in memory cell 40 is mimicked in dynamic delay circuit 176b, and becomes part of the delay therethrough.

P-channel transistor 124 has its drain biased to $V_{cc}$ and its source at node N2, as before; n-channel transistor has its drain connected to node N2, and its gate connected to that of transistor 124 to receive the input signal on line IN. In this case, however, line IN is received from an output of bias circuit 132b, the construction of which will be described in further detail hereinbelow. N-channel transistor 128 has its drain connected to the source of transistor 126, its source at ground, and its gate biased at node IN' by bias circuit 132b. Node N2 drives the input of inverter 122 which, in turn produces sense amp clock signal SCLK at its output OUT, on line 78. Capacitor 130 is connected between node N2 and ground, to again emulate the capacitive load of the length of bit line 52, 54.

Figure 13:
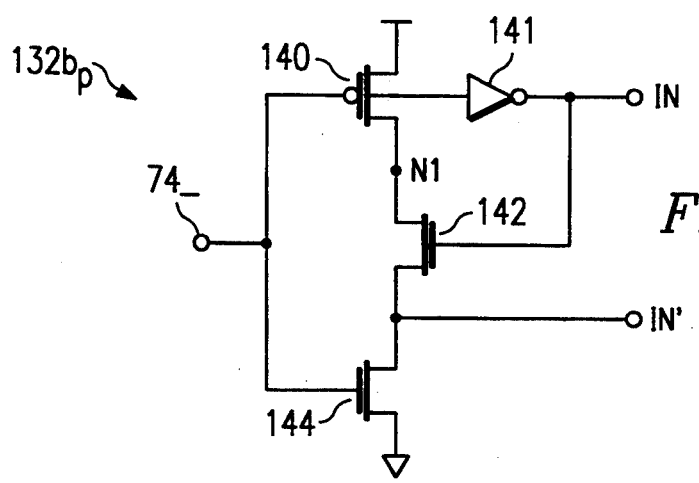
FIG. 13 is an electrical diagram, in schematic form, of a first embodiment of a dynamic bias circuit useful in the delay circuit of FIG. 12.

Bias circuit 132b, in this embodiment of the invention, receives the input clock signal on line 74$_{13}$ (i.e., of opposite polarity as that presented to delay circuit 176a described above), and uses this input clock signal to bias transistor 128 in a dynamic fashion. Referring now to FIG. 13, a first implementation of bias circuit 132bp, for the case where p-channel devices are used as bit line loads 55, will now be described in detail.

In bias circuit 132$b_p$ of FIG. 13, input line 74$_{13}$ is connected to the gates of p-channel transistor 140 and n-channel transistor 144. Transistor 140 has its source connected to $V_{cc}$ and its drain at node N1, and is preferably of the same size, dimension and drive as bit line load 55 in memory array 64. Transistor 144 has its drain connected to node IN' and its source at ground. N-channel transistor 142, having the same size and dimensions as one of pass transistors 52, 54 in memory array 64, has its drain connected to node N1 and its source connected to IN'. Input line 74$_{13}$ is also connected to an input of inverter 141 which drives node IN and the gate of transistor 142 at its output.

In operation, prior to the application of an input clock signal, input line 74$_{13}$ is at a high logic level. This turns off transistor 140, maintains line IN low (via inverter 141), and turns on transistor 144 so that line IN' is pulled to ground, turning off transistor 128 (FIG. 12). In this condition, no DC current is drawn through bias circuit 132$b_p$ or through delay circuit 176b. Upon activation of the input clock signal that is to be used to generate the sense amplifier clock signal SCLK, line 74$_{13}$ is driven to a low logic level. This turns off transistor 144 to disconnect node IN' from ground, and turns on transistor 140 to present a model bit line load to node N1. Line IN is driven high by inverter 141, and transistor 142 is turned on. Node IN' is then biased through the source follower action of transistor 142 to a voltage corresponding to that at the higher voltage one of the cross-coupled nodes in memory cell 40, considering the threshold voltage drop through pass transistor 52, 54, as presented via transistor 142.

Referring back to FIG. 12, with line IN driven high by inverter 141, transistor 124 is turned off and 126 is turned on. The response at node N2 to transistor 126 turning on is controlled by transistor 128, and by the bias produced at node IN' by bias circuit 132$b_p$, so as to match that being produced at the same time by the selected memory cell 40 in memory array 64. Upon node N2 reaching a substantially low voltage, inverter 122 will produce the sense amplifier clock signal SCLK at its output OUT on line 78. Because of its construction, delay circuit 176b delays the generation of sense amplifier clock signal SCLK until a time corresponding to the bit line separation in memory array 64, ensuring proper sensing. In addition, similarly as discussed above, the correspondence of the device sizes in delay circuit 176b to those in memory cell 40, as well as to bit line loads 55 and bit lines 52, 54, allows delay circuit 176b to compensate for the effects of substrate bias, processing variations, and the like.

Figure 14:
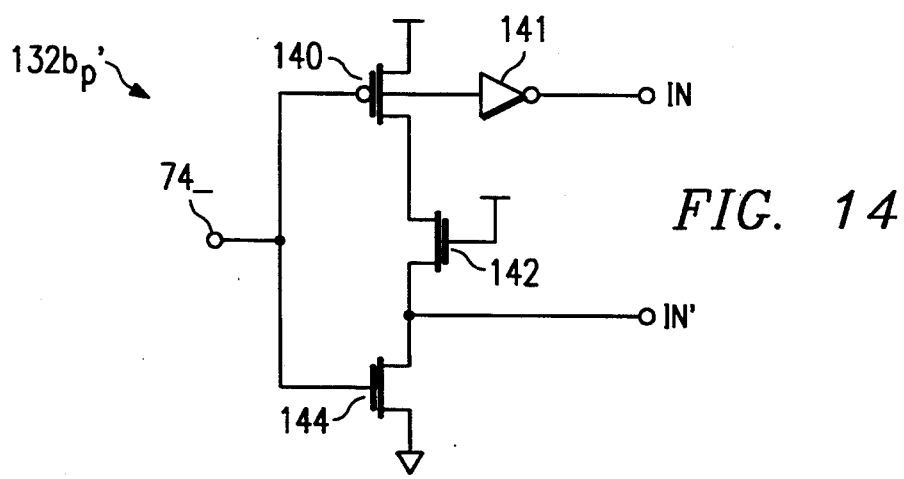
FIG. 14 is an electrical diagram, in schematic form, of a second embodiment of a dynamic bias circuit useful in the delay circuit of FIG. 12.

Referring now to FIG. 14, bias circuit 132$b_p$' according to a second implementation for p-channel bit line loads will now be described. Bias circuit 132$b_p$' is constructed similarly as bias circuit 132$b_p$ described hereinabove relative to FIG. 13 (and as such, the reference numerals from FIG. 13 are retained for identical components in FIG. 14), except that transistor 142' has its gate connected to $V_{cc}$ so as to model pass transistors 52, 54.

Figure 15:
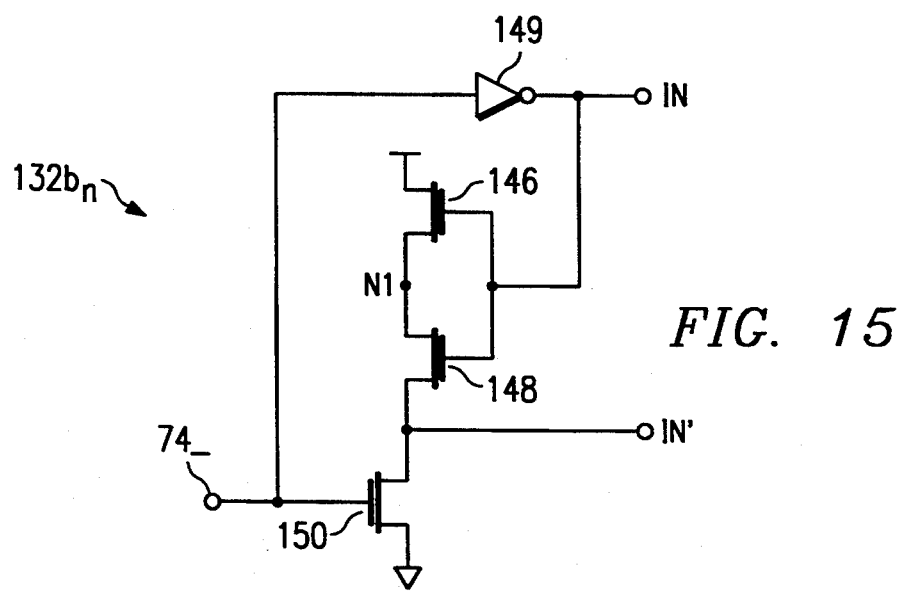
FIG. 15 is an electrical diagram, in schematic form, of a third embodiment of a dynamic bias circuit useful in the delay circuit of FIG. 12.

FIG. 15 illustrates n-channel bias circuit 132$b_n$, useful in dynamic delay circuit 176b for those memories in which bit line loads 55 are n-channel devices. Bias circuit 132$b_n$ includes transistor 146 having its drain connected to $V_{cc}$ and its source at node N1; the size, drive and other characteristics of transistor 146 preferably match those of the devices used as bit line load 55. N-channel transistor 148 has its drain at node N1 and its source at node IN', and preferably has dimensions and drive characteristics matching those of pass transistors 52, 54 of memory cell 40. The input clock signal on line 74$_{13}$ is received at the input of inverter 149, the output of which drives node IN and also drives the gates of transistors 146, 148, which are connected in common. Alternatively, the gate of one of transistors 146, 148 may be biased to $V_{cc}$. Transistor 150 has its drain connected to node IN', its source at ground, and its gate receiving the input clock signal at line 74$_{13}$.

In operation, as in the case of bias circuits 132$b_p$, input line 74$_{13}$ is at a high logic level prior to the application of an input clock signal. In this condition, node IN is low, turning off transistors 146, 148, while the high logic level at line 74__ turns on transistor 150 to pull node IN' to ground. Upon activation of the input clock signal upon which the sense amplifier clock signal SCLK is to be derived, line 74__ is driven to a low logic level, driving node IN high via inverter 149. Transistor 144 is also turned off at this time, disconnecting node IN' from ground. The high level at node IN turns on transistor 146 to present a model bit line load to node N1, and also turns on transistor 148 in a similar manner as a pass transistor 52, 54. The voltage at node IN' is biased through the source follower action of transistor 148 to a voltage on the order of $V_{cc}$ minus the greater of the threshold voltages of the model bit line load (transistor 146) and the model pass device (transistor 148). The voltage at node IN' will thus correspond to the voltage at the higher voltage one of the cross-coupled nodes in memory cell 40 when initially selected (i.e., the minimum memory cell high level).

Bias circuits $132b_p$, $132b_n$ described hereinabove each provide the advantage of biasing transistor 128 in delay circuit 176b in a manner that accurately compensates for the actual devices in the memory array 64, including the bit line load and also the threshold drop across pass transistors 52, 54. In this dynamic embodiment, these proper bias voltages are presented without requiring a low load as in the static case and therefore without static current drawn therethrough, and also without requiring additional control signals such as chip enable or chip select signals to be routed to delay circuit 176b.

Both the static and dynamic delay circuits 176a, 176b thus provide an output clock signal that is delayed from an input signal in a manner closely matching that of the memory cell devices. Accordingly, the generation of sense amplifier clock signal SCLK by delay circuits 176a, 176b according to these embodiments of the invention provide the additional advantages of compensating for the threshold voltage drop across the pass transistors 52, 54 in memory array 64. This compensation includes compensation for increases in the threshold voltage due to the body effect.

While the invention has been particularly shown and described with reference to its preferred embodiments, it will be understood by those skilled in the art that various changes in form and detail may be made therein without departing from the spirit and scope of the invention.

We claim:

1. A delay circuit in an integrated circuit memory of the type having a plurality of memory cells, each memory cell comprising cross-coupled inverters connectable to differential bit lines by way of pass transistors controlled by a word line signal, each of the cross-coupled inverters comprising a drive transistor and a load;

wherein the delay circuit is for generating an output clock signal responsive to an input clock signal, delayed in a manner corresponding to the response of the memory cell when accessed, and comprises:

a first transistor, having a size corresponding to one of the pass transistors, having a gate for receiving the input clock signal, and having a source-drain path coupled on one side to an output node;

a second transistor, having a size corresponding to one of the drive transistors, having a gate, and having a source-drain path coupled between a second side of the source-drain path of the first transistor and a reference voltage; and a bias circuit, having an output coupled to the gate of the second transistor, for generating a voltage corresponding to a high level voltage in the memory cell.

2. The delay circuit of claim 1, further comprising:
a capacitive load coupled to the output node, having a capacitance modeling a load of one of the bit lines.

3. The delay circuit of claim 1, further comprising:
a pull-up transistor, having a source-drain path coupled between the output node and a power supply voltage, and having a gate coupled to receive the input clock signal, for biasing the output node toward the power supply voltage responsive to the input clock signal being in an inactive state.

4. The delay circuit of claim 1, wherein said bias circuit comprises:
a model bit line load, coupled on one side to a power supply voltage; and
a third transistor, having a source-drain path coupled between the model bit line load and the output of the bias circuit, and having a gate biased to a voltage such that said third transistor is conductive, said third transistor having a size corresponding to one of the pass transistors.

5. The delay circuit of claim 4, further comprising:
a low load, coupled between the output of the bias circuit and a reference voltage.

6. The delay circuit of claim 4, wherein the memory includes bit line loads coupled to bit lines therein;
and wherein said model bit line load comprises:
a transistor, having a conductivity type and size corresponding to a bit line load to which the bit line in the memory is coupled.

7. The delay circuit of claim 4, further comprising:
an isolate transistor, having a source-drain path coupled in series with said model bit line load between the output of said bias circuit and the power supply voltage, and having a gate for receiving a select signal which, when inactive, makes said isolate transistor non-conductive.

8. The delay circuit of claim 7, further comprising:
a discharge transistor, having a source-drain path coupled between the output of said bias circuit and a reference voltage, and having a gate for receiving the select signal which, when inactive, makes said discharge transistor conductive.

9. The circuit of claim 1, wherein the output clock signal of the delay circuit controls a sense amplifier in the integrated circuit memory.

10. The circuit of claim 1, wherein the memory cell high level voltage corresponds to a power supply voltage less the threshold voltage of one of the pass transistors.

11. In an integrated circuit memory of the type having a plurality of memory cells, each comprising cross-coupled inverters connectable to differential bit lines by way of pass transistors controlled by a word line signal, each of the cross-coupled inverters comprising a drive transistor and a load, a delay circuit for generating an output clock signal responsive to an input clock signal, delayed in a manner corresponding to the response of the memory cell when accessed, comprising:

a first transistor, having a size corresponding to one of the pass transistors, having a gate for receiving the input clock signal, and having a source-drain path coupled on one side to an output node;

a second transistor, having a size corresponding to one of the drive transistors, having a gate, and having a source-drain path coupled between a second side of the source-drain path of the first transistor and a reference voltage; and a bias circuit, having an output coupled to the gate of the second transistor, for generating a voltage corresponding to a high level voltage in the memory cell, comprising:

a model bit line load transistor, having a source-drain path coupled between a power supply voltage and an intermediate node, and having a gate coupled to receive the input clock signal in such a manner that said model bit line load transistor is non-conductive responsive to said input clock signal being active and conductive responsive to said input clock signal being inactive;

a third transistor, having a source-drain path connected between the intermediate node and the output of the bias circuit, and having a gate biased so that said third transistor is conductive while the model bit line load transistor is conductive, said third transistor having a size corresponding to one of the pass transistors; and a discharge transistor, having a source-drain path coupled between the output of said bias circuit and a reference voltage, and having a gate coupled to receive the input clock signal in such a manner that said discharge transistor is non-conductive responsive to said input clock signal being inactive and conductive responsive to said input clock signal being active.

12. The delay circuit of claim 11, wherein the gate of the third transistor is biased to a power supply voltage.

13. An integrated circuit memory, comprising:
a plurality of memory cells arranged in rows and columns, each column associated with a pair of differential bit lines, and each row associated with a word line, each of said memory cells comprising:
a pair of cross-coupled inverters, each including a drive transistor and a load;
a pair of pass transistors, each having a source-drain path connected between one of the cross-coupled inverters and one of the differential bit lines, and each having a gate controlled by a word line;
a clocked sense amplifier, coupled to one of the pairs of differential bit lines, and having a clock input;
a delay circuit having an output to the clock input of the clocked sense amplifier, for generating a sense amplifier clock signal responsive to an input clock signal, comprising:
a first transistor, having a size corresponding to one of the pass transistors, having a gate for receiving the input clock signal, and having a source-drain path coupled on one side to an output node;
a second transistor, having a size corresponding to one of the drive transistors, having a gate, and having a source-drain path coupled between a second side of the source-drain path of the first transistor and a reference voltage; and
a bias circuit, having an output coupled to the gate of the second transistor, for generating a voltage at its output corresponding to a high level voltage in one of the plurality of memory cells.

14. The memory of claim 13, wherein the delay circuit further comprises:
a capacitive load coupled to the output node, having a capacitance modeling a load of one of the bit lines.

15. The memory of claim 13, wherein the delay circuit further comprises:
a pull-up transistor, having a source-drain path coupled between the output node of the delay circuit and a power supply voltage, and having a gate coupled to receive the input clock signal, for biasing the output node toward the power supply voltage responsive to the input clock signal being in an inactive state.

16. The memory of claim 13, further comprising:
a plurality of bit line loads, each coupled between one of the bit lines and a reference voltage;
and wherein said bias circuit comprises:
a model bit line load, having characteristics corresponding to one of the bit line loads, and coupled on one side to a power supply voltage; and
a third transistor, having a source-drain path coupled between said model bit line load and the output of the bias circuit, and having a gate biased to a voltage such that said third transistor is conductive, said third transistor having a size corresponding to one of the pass transistors; and
a low load, coupled between the output of the bias circuit and a reference voltage.

17. The memory of claim 16, wherein said model bit line load comprises a p-channel transistor.

18. The memory of claim 16, wherein the delay circuit further comprises:
an isolate transistor, having a source-drain path coupled in series with said model bit line load between the output of said bias circuit and the power supply voltage, and having a gate for receiving a select signal which, when inactive, makes said isolate transistor non-conductive; and
a discharge transistor, having a source-drain path coupled between the output of said bias circuit and a reference voltage, and having a gate for receiving the select signal which, when inactive, makes said discharge transistor conductive.

19. The memory of claim 13, further comprising:
a plurality of bit line loads, each coupled between one of the bit lines and a reference voltage;
and wherein said bias circuit comprises:
a model bit line load transistor, having characteristics corresponding to one of the bit line loads, having a source-drain path coupled between a power supply voltage and an intermediate node, and having a gate coupled to receive the input clock signal in such a manner that said model bit line load transistor is non-conductive responsive to said input clock signal being active and conductive responsive to said input clock signal being inactive;
a third transistor, having a source-drain path connected between the intermediate node and the output of the bias circuit, and having a gate biased so that said third transistor is conductive while the model bit line load transistor is conductive, said third transistor having a size corresponding to one of the pass transistors; and
a discharge transistor, having a source-drain path coupled between the output of said bias circuit and a reference voltage, and having a gate coupled to receive the input clock signal in such a manner that said discharge transistor is non-conductive responsive to said input clock signal being inactive and conductive responsive to said input clock signal being active.

20. The memory of claim 13, wherein the memory cell high level voltage corresponds to a power supply voltage less the threshold voltage of one of the pair of pass transistors.

* * * * *